US010222293B2

(12) United States Patent
Ooki et al.

(10) Patent No.: US 10,222,293 B2
(45) Date of Patent: Mar. 5, 2019

(54) OPTICAL CHARACTERISTIC MEASURING METHOD, OPTICAL CHARACTERISTIC ADJUSTING METHOD, EXPOSURE APPARATUS, EXPOSING METHOD, AND EXPOSURE APPARATUS MANUFACTURING METHOD BY DETECTING A LIGHT AMOUNT OF MEASURING LIGHT

(75) Inventors: Hiroshi Ooki, Yokohama (JP); Ayako Nakamura, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 775 days.

(21) Appl. No.: 12/654,590

(22) Filed: Dec. 23, 2009

(65) Prior Publication Data
US 2010/0195072 A1 Aug. 5, 2010

Related U.S. Application Data

(63) Continuation of application No. PCT/JP2008/061496, filed on Jun. 24, 2008.

(30) Foreign Application Priority Data

Jun. 26, 2007 (JP) ................................. 2007-167857

(51) Int. Cl.
G03B 27/54 (2006.01)
G01M 11/02 (2006.01)
(Continued)

(52) U.S. Cl.
CPC .......... G01M 11/0264 (2013.01); G03F 1/44 (2013.01); G03F 7/706 (2013.01); G03F 7/7085 (2013.01); G03F 7/70258 (2013.01)

(58) Field of Classification Search
CPC .... G01M 11/0264; G03F 1/44; G03F 7/7085; G03F 7/70258; G03F 7/706; G03F 7/70591
(Continued)

(56) References Cited

U.S. PATENT DOCUMENTS

| 5,666,205 A | 9/1997 | Tateno et al. |
| 5,912,726 A * | 6/1999 | Toguchi et al. ................. 355/53 |
| 2006/0132775 A1* | 6/2006 | Sengers et al. ............... 356/401 |

FOREIGN PATENT DOCUMENTS

| JP | 63-84025 | 4/1988 |
| JP | 63-084025 | 4/1988 |

(Continued)

OTHER PUBLICATIONS

International Search Report, dated Sep. 9, 2008.
(Continued)

*Primary Examiner* — Hung Nguyen

(57) ABSTRACT

There is provided an optical characteristic measuring method for measuring an optical characteristic of an optical system which forms, on a second plane, an image of an object arranged on a first plane, the optical characteristic measuring method including: arranging, on the first plane, a first area through which a measuring light passes or by which the measuring light is reflected; arranging a second area, through which the measuring light passes or by which the measuring light is reflected, on the second plane at a position corresponding to the first area; and detecting, via one of the first area and the second area, a light amount of the measuring light via the optical system and the other of the first area and the second area; wherein at least one of the first area and the second area has a shape such that a light amount, of the measuring light which passes or which is reflected via the optical system, is changed depending on the optical characteristic.

21 Claims, 18 Drawing Sheets

(51) Int. Cl.
*G03F 1/44* (2012.01)
*G03F 7/20* (2006.01)

(58) Field of Classification Search
USPC .................................................. 355/67, 53
See application file for complete search history.

(56) References Cited

FOREIGN PATENT DOCUMENTS

| | | |
|---|---|---|
| JP | 05-160000 | 6/1993 |
| JP | 10-027736 | 1/1998 |
| JP | 2000-1211498 | 4/2000 |
| JP | 2000-258300 | 9/2000 |

OTHER PUBLICATIONS

Korean Office Action dated May 27, 2014 in corresponding Korean Patent Application No. 10-2010-7001547.
Extended European Search Report dated May 17, 2017 in related European Application No. 08777561.5.
European Office Action dated Feb. 13, 2018 in related European Patent Application No. 08777561.5.

* cited by examiner

OPTICAL CHARACTERISTIC MEASURING METHOD, OPTICAL CHARACTERISTIC ADJUSTING METHOD, EXPOSURE APPARATUS, EXPOSING METHOD, AND EXPOSURE APPARATUS MANUFACTURING METHOD BY DETECTING A LIGHT AMOUNT OF MEASURING LIGHT

CROSS-REFERENCES TO RELATED APPLICATIONS

This application is a Continuation Application of International Application No. PCT/JP2008/061496 which was filed on Jun. 24, 2008 claiming the conventional priority of Japanese patent Application No. 2007-167857 filed on Jun. 26, 2007.

BACKGROUND OF THE INVENTION

Field of the Invention

The present invention relates to an optical characteristic measuring method for measuring an optical characteristic of an optical system usable to produce an electronic device including, for example, semiconductor elements and liquid crystal display elements in the lithography step; an optical characteristic adjusting method for adjusting the optical characteristic of the optical system; an exposure apparatus provided with the optical system adjusted in accordance with the adjusting method; an exposure method based on the use of the exposure apparatus; and an exposure apparatus producing method for producing the exposure apparatus.

Description of the Related Art

For example, when a semiconductor element or a liquid crystal display element, etc. is produced, an exposure apparatus is used to expose a substrate (a glass plate, a semiconductor wafer, etc.) coated with a resist via an optical system (projection optical system) with a pattern formed on a mask (for example, a reticle or a photomask). It is necessary for the exposure apparatus to project the pattern formed on the mask onto the substrate at a high resolution. Therefore, the optical system, which is provided for the exposure apparatus, is designed to have satisfactory optical characteristics in which various aberrations are sufficiently corrected.

However, it is difficult to produce the optical system as exactly as designed. The optical system, which is actually produced, has any optical characteristic which is different from the designed optical characteristic in some cases. Therefore, it is necessary that the optical characteristic of the produced optical system should be measured to adjust the optical characteristic of the optical system based on an obtained measurement result. For example, Japanese Patent Application Laid-open No. 2000-121498 describes a technique for measuring an optical characteristic of an optical system, wherein an aperture, which is provided on a substrate stage, is moved relative to a spatial image of a measuring pattern formed via the optical system to obtain a light intensity distribution of the spatial image of the measuring pattern passing through the aperture so that the optical characteristic of the imaging optical system is measured based on the amount of change of the obtained intensity distribution of the spatial image.

SUMMARY OF THE INVENTION

In accordance with the progress of fine and minute mask patterns, it becomes necessary that the optical characteristic of the optical system provided on the exposure apparatus should be measured more highly accurately. However, in the case of the conventional method for measuring the optical characteristic, the intensity distribution of the spatial image is obtained by moving the aperture provided on the substrate stage relative to the spatial image of the measuring pattern as described above. Therefore, the movement accuracy of the substrate stage greatly affects the measurement accuracy of the optical characteristic.

On the other hand, it is conceived that the intensity distribution of the spatial image of the measuring pattern is obtained by directly detecting the spatial image of the measuring pattern via the optical system by a sensor such as CCD or the like without moving the substrate stage. However, in this case, it is necessary that the sensor should have a spatial resolution required to detect the intensity distribution of the spatial image. That is, it is necessary that the pixels of the sensor such as CCD or the like should be sufficiently small-sized depending on the spatial resolution. However, at present, any sensor, which satisfies this requirement, does not exist. Therefore, it has been difficult to measure the optical characteristic of the optical system highly accurately.

Another method is also known, in which a magnifying optical system is arranged on the side of the light-incident surface of the sensor in order to obtain a necessary spatial resolution by the sensor such as CCD or the like. However, a problem arises such that the measuring system is large-sized due to the arrangement of the magnifying optical system.

An object of the present invention is to provide an optical characteristic measuring method which makes it possible to measure an optical characteristic of an optical system highly accurately, an optical characteristic adjusting method which makes it possible to adjust the optical characteristic of the optical system highly accurately, an exposure apparatus which is provided with the optical system adjusted in accordance with the adjusting method, an exposure method which uses the exposure apparatus, and an exposure apparatus producing method for producing the exposure apparatus.

There is provided an optical characteristic measuring method for measuring an optical characteristic of an optical system which forms, on a second plane, an image of an object arranged on a first plane, the optical characteristic measuring method comprising: arranging, on the first plane, a first area through which a measuring light passes or by which the measuring light is reflected; arranging a second area, through which the measuring light passes or by which the measuring light is reflected, on the second plane at a position corresponding to the first area; and detecting, via one of the first area and the second area, a light amount of the measuring light via the optical system and the other of the first area and the second area; wherein at least one of the first area and the second area has a shape such that the light amount, of the measuring light which passes or reflected via the optical system, is changed depending on the optical characteristic.

There is provided an optical characteristic adjusting method comprising: measuring an optical characteristic of an optical system in accordance with the optical characteristic measuring method; and adjusting the optical characteristic of the optical system by using a measurement result obtained in the measuring.

There is provided an exposure apparatus which forms a pattern of a mask on a photosensitive substrate, the exposure apparatus comprising an optical system which is adjusted in accordance with the optical characteristic adjusting method.

There is provided an exposure apparatus which forms a pattern of a mask via an optical system on a photosensitive substrate, the exposure apparatus comprising: a first pattern having a first area which is arranged on one of an object plane and an image plane of the optical system and through which a measuring light passes or by which the measuring light is reflected; a second pattern having a second area which is arranged, on the other of the object plane and the image plane of the optical system, at a position corresponding to the first area and through which the measuring light passes or by which the measuring light is reflected; and a detecting section which detects, via one of the first pattern and the second pattern, a light amount of the measuring light via the optical system and the other of the first pattern and the second pattern; wherein at least one of the first area and the second area has a shape such that the light amount, of the measuring light which passes or which is reflected via the optical system, is changed depending on an optical characteristic of the optical system.

There is provided an exposure method for forming a pattern of a mask on a photosensitive substrate, the exposure method comprising: illuminating the pattern; and forming the illuminated pattern on the photosensitive substrate by an optical system adjusted in accordance with the optical characteristic adjusting method.

There is provided an exposure apparatus producing method for producing an exposure apparatus which forms a pattern of a mask via an optical system on a photosensitive substrate, the exposure apparatus producing method comprising: adjusting an optical characteristic of the optical system in accordance with the optical characteristic adjusting method; and installing, in the exposure apparatus, the adjusted optical system.

There is provided an exposure apparatus producing method for producing an exposure apparatus which forms a pattern of a mask via an optical system on a photosensitive substrate, the exposure apparatus producing method comprising: installing the optical system in the exposure apparatus; and adjusting an optical characteristic of the optical system installed in the exposure apparatus in accordance with the optical characteristic adjusting method.

According to the optical characteristic measuring method, at least one of the first area and the second area has a shape such that the light amount of the measuring light which passes or which is reflected via the optical system is changed depending on the optical characteristic of the optical system. Therefore, the optical characteristic of the optical system can be measured highly accurately without scanning the spatial image of one of the first area and the second area relative to the other of the first area and the second area.

According to the optical characteristic adjusting method, the optical characteristic of the optical system is measured in accordance with the optical characteristic measuring method, and the optical characteristic of the optical system is adjusted by using the obtained measurement result. Therefore, it is possible to obtain the optical system having a satisfactory optical characteristic.

According to the exposure apparatus, the exposure apparatus is provided with the optical system adjusted in accordance with the optical characteristic adjusting method. Therefore, the pattern of the mask can be formed on the photosensitive substrate at a high resolution via the optical system having the satisfactory optical characteristic in relation to the image of the pattern arranged on the first plane.

According to the exposure apparatus, at least one of the first area and the second area has a shape such that the light amount, of the measuring light allowed to pass or reflected via the optical system, is changed depending on the optical characteristic of the optical system. Therefore, the optical characteristic of the optical system can be measured highly accurately without scanning the spatial image of one of the first area and the second area relative to the other of the first area and the second area. Therefore, the image of the pattern of the mask can be formed on the photosensitive substrate at a high resolution via the optical system having the satisfactory optical characteristic.

According to the exposure method, the pattern of the mask can be formed on the photosensitive substrate at a high resolution by the optical system adjusted in accordance with the optical characteristic adjusting method.

According to the exposure apparatus producing method, the optical characteristic of the optical system is adjusted in accordance with the optical characteristic adjusting method, and the adjusted optical system is installed in (provided on, disposed in) the exposure apparatus. Alternatively, the optical system is installed in or provided on the exposure apparatus, and the optical characteristic of the optical system installed in the exposure apparatus is adjusted in accordance with the optical characteristic adjusting method. Therefore, it is possible to produce the exposure apparatus provided with the optical system having the satisfactory optical characteristic.

DESCRIPTION OF THE PREFERRED EMBODIMENTS

Figure 1:
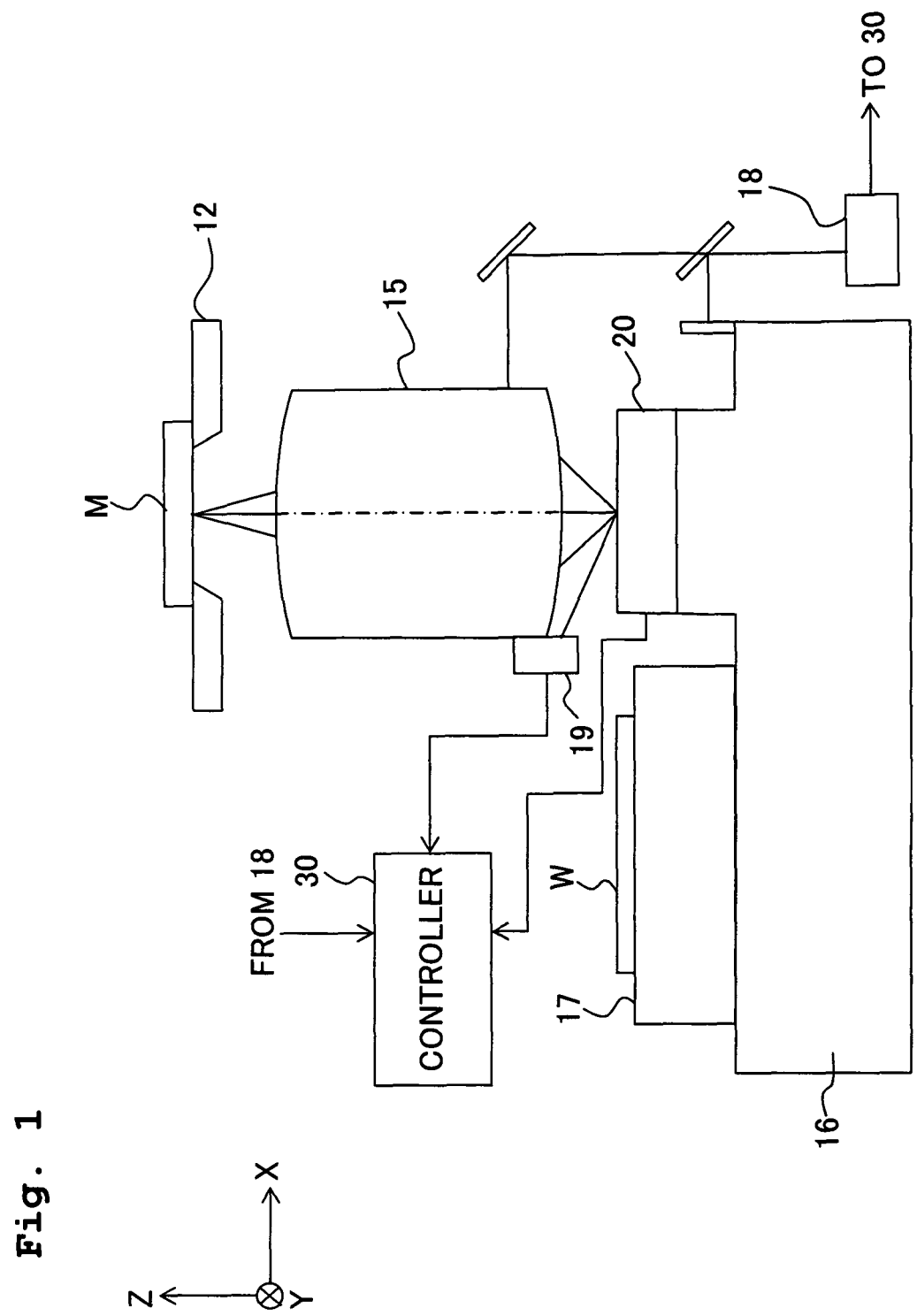
FIG. 1 shows a schematic construction of a projection exposure apparatus according to an embodiment.

A projection exposure apparatus (exposure apparatus) according to an embodiment will be explained below with reference to the drawings. FIG. 1 shows a schematic construction of the projection exposure apparatus according to this embodiment.

In the following description, an XYZ rectangular coordinate system is set as shown in each of the drawings. An explanation will be made about the positional relationship of respective members with reference to the XYZ rectangular coordinate system. The XYZ rectangular coordinate system is set so that the X axis and the Y axis are parallel to a wafer (photosensitive substrate) W, and the Z axis is set in a direction perpendicular to the wafer W. It is assumed that the X axis extends in a direction parallel to the sheet surface of FIG. 1, and the Y axis extends in a direction perpendicular to the sheet surface of FIG. 1.

The projection exposure apparatus shown in FIG. 1 includes a light source (not shown) which supplies an exposure light (exposure light beam); an illumination optical system (not shown) which uniformly illuminates a mask M with the light or light beam from the light source; and a projection optical system (optical system) 15 which images a pattern formed on the mask M on the wafer W. The projection exposure apparatus further includes a mask stage 12 which holds the mask M and which is capable of adjusting the position of a pattern formation surface of the mask M with respect to the object plane of the projection optical system 15 (plane parallel to the XY plane); and a wafer stage 16 which holds the wafer W and which is capable of adjusting the position of the surface of the wafer W with respect to the image plane of the projection optical system 15 (plane parallel to the XY plane).

The embodiment of the present invention is explained as exemplified by the wafer W as the substrate by way of example. However, the substrate is not limited to the wafer W, and may be a glass plate.

The light or light beam, which exits from the light source, illuminates the mask M via the illumination optical system at a uniform illuminance in a superimposed or overlay manner. Those usable as the light source include light sources of the mercury lamp, the KrF excimer laser, the ArF excimer laser, the $F_2$ laser, the extreme ultraviolet light, etc.

The light, via or passing through the mask M, comes into the projection optical system 15. The projection optical system 15 is constructed of a plurality of optical members. The projection optical system 15 images the pattern formed on the mask M at a predetermined magnification (reducing magnification, 1× magnification, or magnifying magnification) on the wafer W. The wafer stage 16 which holds the wafer W is constructed of an XY stage which is movable in the directions of the X axis and the Y axis, a Z stage which is movable in the direction of the Z axis and which is inclinable with respect to the Z axis, etc. The Z stage of the wafer stage 16 is provided with a wafer holder 17 which attracts and holds the wafer W. Respective exposure areas, which are formed on the wafer W, are successively exposed with the transfer pattern of the mask M while the wafer stage 16 is two-dimensionally driven and controlled in the XY plane. The projection exposure apparatus is provided with a wafer stage interferometer 18 which measures a position in the XY plane on the wafer W, and an autofocus system 19 which measures the position of the wafer W in the Z direction. Measurement results obtained by the wafer stage interferometer 18 and the autofocus system 19 are outputted to a controller 30.

Figure 5A:
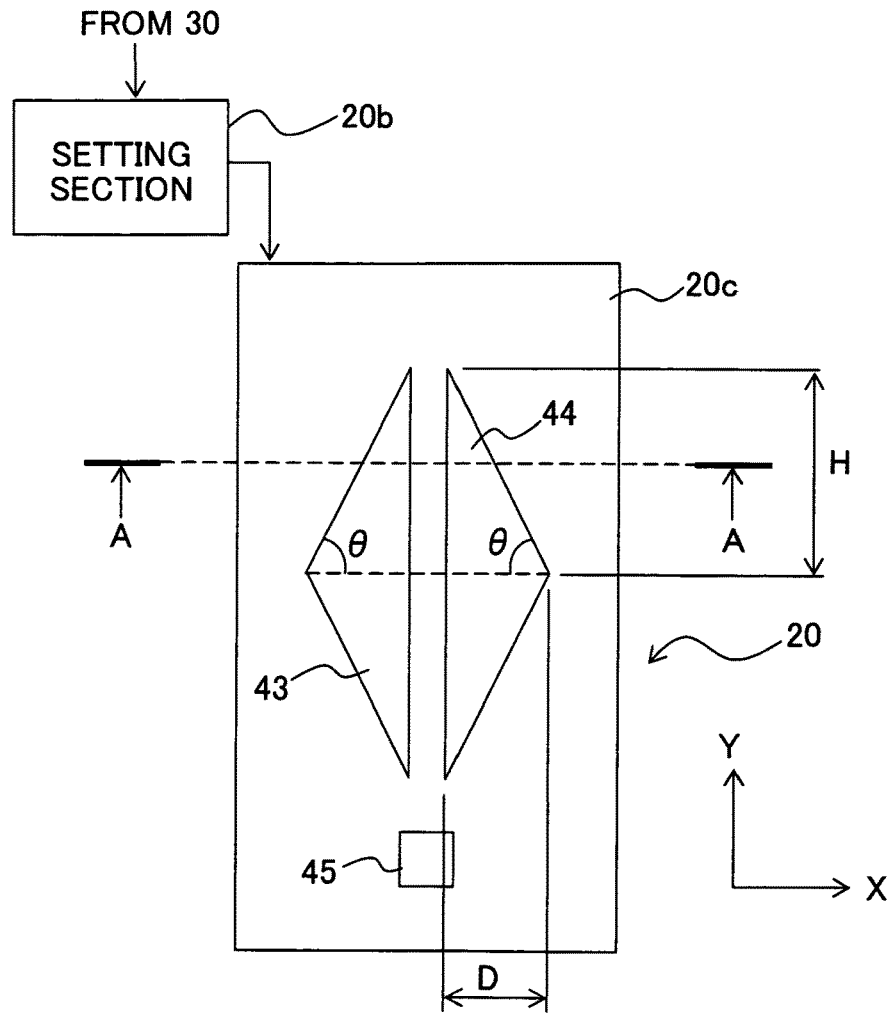
FIGS. 5A and 5B show a construction of a measuring device according to the embodiment.
Figure 5B:
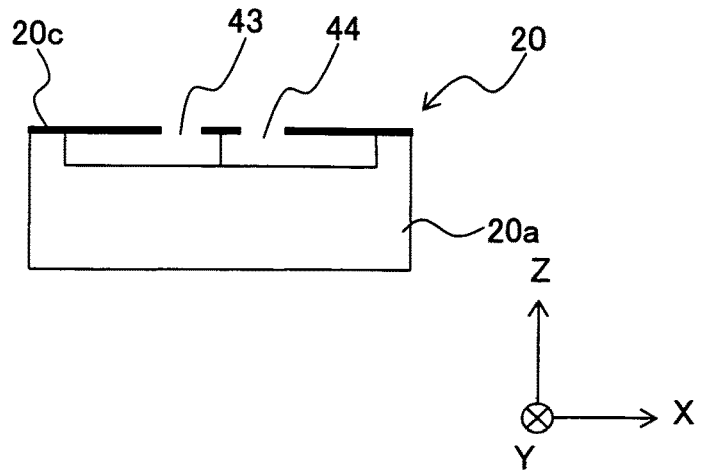

The projection exposure apparatus is provided with a measuring device 20 which measures the optical characteristic of the projection optical system 15. As shown in FIG. 5 (FIGS. 5A and 5B), the measuring device 20 includes a pattern plate 20c which has two apertures or openings (light-receiving patterns) 43, 44; and a sensor section 20a (CCD or a light amount detection sensor, etc.) which serves as a detecting section which receives the lights passing through the two apertures 43, 44. With reference to FIG. 1, the measuring device 20 is installed or provided on the wafer stage 16 and in the vicinity of the wafer holder 17. The pattern formation surface of the pattern plate 20c is set at a height approximately same as that of the surface of the wafer W. The construction of the measuring device 20 will be described later on. A measurement result obtained by the measuring device 20 is outputted to the controller 30.

The controller 30 adjusts the optical characteristic of the projection optical system 15 based on the measurement result outputted from the measuring device 20. A measuring method and an adjusting method for the optical characteristic of the projection optical system 15 will be described and explained in detail later on.

Next, an explanation will be made about a method for producing the projection exposure apparatus (exposure apparatus) according to this embodiment with reference to a flow chart shown in FIG. 2.

At first, the projection optical system 15 is designed so that various aberrations are sufficiently corrected to provide satisfactory optical characteristics. The projection optical system 15, which is produced after the design, is installed or arranged in the projection exposure apparatus at a predetermined position (Step S10, installing step). Subsequently, the optical characteristic, of the projection optical system 15 installed in the projection exposure apparatus in Step S10, is measured (Step S11, measuring step). That is, various aberrations, which result from a variety of factors, remain in some cases in the actually produced projection optical system. Therefore, the optical characteristic of the projection optical system is measured. It is judged whether or not the optical characteristic of the projection optical system 15 is satisfactory based on the measurement result (Step S12). If the optical characteristic of the projection optical system 15 is not satisfactory, the optical characteristic of the projection optical system 15 is adjusted (Step S13, adjusting step). The routine returns to Step S11 to measure the optical characteristic of the projection optical system 15 again. On the other hand, if the optical characteristic of the projection optical system 15 is satisfactory, the production of the projection exposure apparatus is completed.

Figure 3:
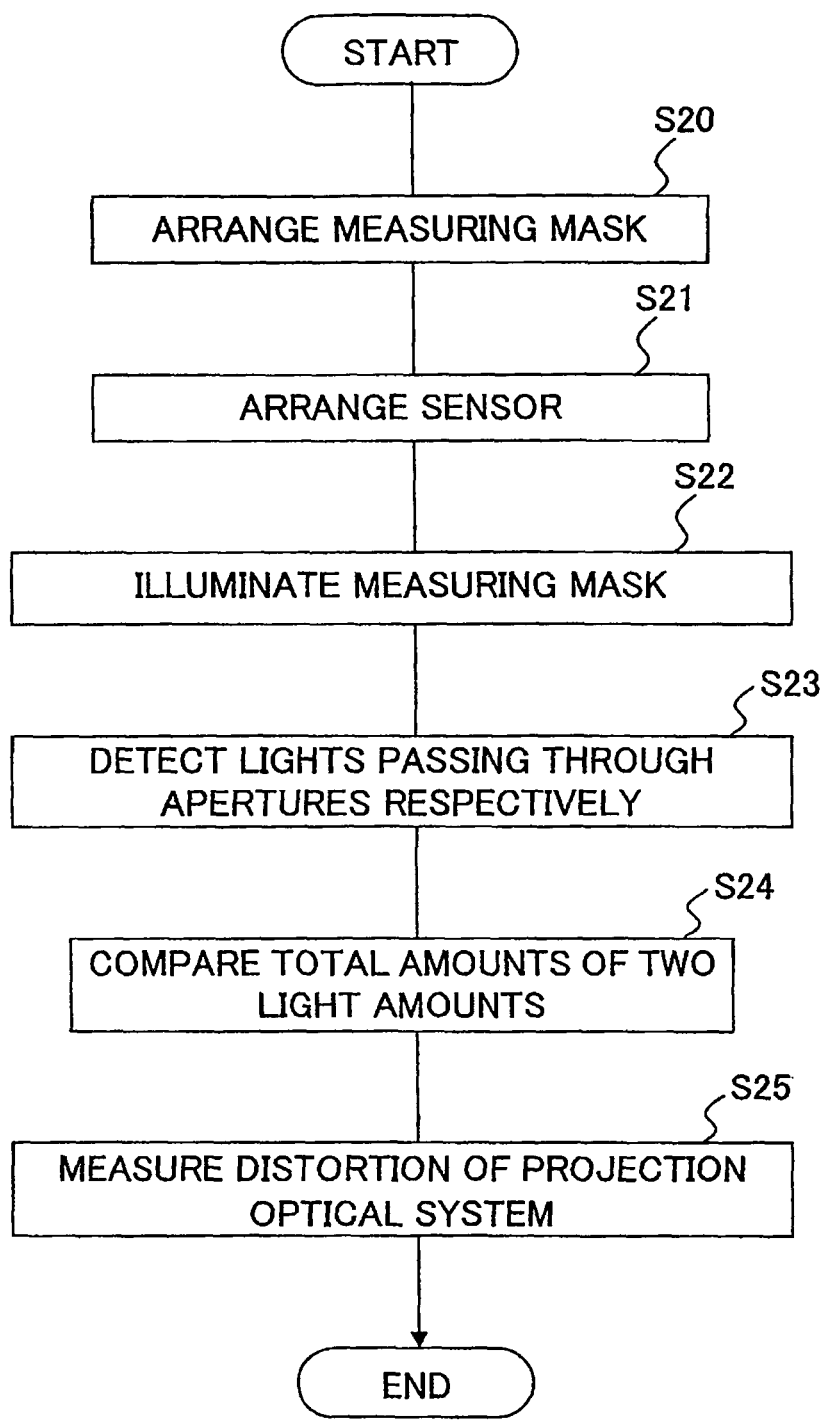
FIG. 3 shows a flow chart for illustrating a method for measuring the optical characteristic of the projection optical system according to the embodiment.

FIG. 3 shows a flow chart for illustrating the method for measuring the optical characteristic of the projection optical system 15 according to this embodiment (measuring step in Step S11).

Here, the optical characteristic of the projection optical system 15 according to this embodiment includes the aberration (aberration represented by the comatic aberration and the distortion) which is asymmetrical with respect to the optical axis of the projection optical system 15 in relation to the measuring direction of the optical characteristic. In this embodiment, an explanation will be made as exemplified by the measurement of the distortion of the projection optical system 15 by way of example.

Figure 4:
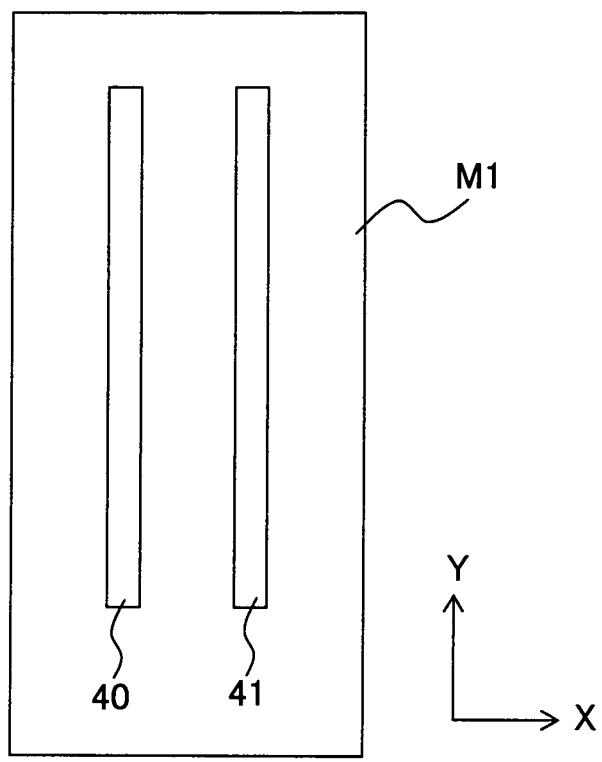
FIG. 4 shows a construction of a measuring mask according to the embodiment.

At first, a measuring mask, having measuring patterns 40, 41 which are formed in the measuring mask and through which the measuring light is passable, is arranged on the mask stage 12 (Step S20). FIG. 4 shows the construction of the measuring mask M1. As shown in FIG. 4, the measuring mask M1 has the two measuring patterns 40, 41 which are formed in the measuring mask M1 and each of which has a width of several μm in the measuring direction (X direction). It is desirable that the widths of the measuring patterns 40, 41 are thick to such an extent that no influence is exerted by the comatic aberration, etc.

Subsequently, by moving the wafer stage 16 in the XY directions, two apertures 43, 44 which are formed on the pattern plate 20c of the measuring device 20 are arranged in the projection area (field) of the projection optical system 15 (Step S21). The two apertures 43, 44 have shapes different from those of the measuring patterns 40, 41 formed on the measuring mask M1; and the shapes of the two apertures 43, 44 are changed in the direction (Y direction) perpendicular to the measuring direction for the optical characteristic of the projection optical system 15. That is, each of the apertures 43, 44 has a shape such that the light amount, of the measuring light passing via the projection optical system 15, is changed depending on the distortion of the projection optical system 15.

Specifically, as shown in FIG. 5A, the shapes of the apertures 43, 44 are triangular shapes which are arranged so that their bases are opposite to or facing each other respectively; and the oblique sides have an angle θ of 0<θ<90 (degrees) with respect to the measuring direction (X direction). The size of the angle θ is determined depending on the magnitudes or dimensions of the required measurement accuracy, the measurement range, and the dynamic range D. In a case that it is intended to measure the distortion more highly accurately, it is desirable that the size of the angle θ is nearer to 90 degrees (however, the angle θ=90 degrees is excluded). When the size of the dynamic range D is fixed, sizes H of the apertures 43, 44, which are provided in the direction (Y direction) perpendicular to the measuring direction, are increased, as the size of the angle θ approaches 90 degrees. The size H in the Y direction is determined depending on, for example, the required measurement range.

The sensor section 20a, which is provided on the measuring device 20, is connected to a setting section which sets a light-receiving area corresponding to the aperture 43, a light-receiving area corresponding to the aperture 44, and a light-receiving area corresponding to a reference aperture 45 in order to independently receive the measuring light passing through the aperture 43, the measuring light passing through the aperture 44, and the measuring light passing through the reference aperture 45, respectively, as described later on. The operation of the setting section 20b is controlled by the controller 30.

When the optical characteristic is measured, the measurement accuracy is affected in some cases by the change in the light amount (light amount change) of the measuring light illuminating the measuring mask M1 therewith. Accordingly, in this embodiment, the pattern plate 20c is formed with the reference aperture 45 in order to monitor the light amount change of the measuring light. In a case that the light amount change of the measuring light is monitored, the setting section 20b sets the light-receiving area corresponding to the reference aperture 45 to detect the measuring light passing through the reference aperture 45. The light amount of the measuring light passing through the reference aperture 45 is monitored, and the measurement result of the optical characteristic of the projection optical system 15 is corrected based on the monitoring result. Accordingly, it is possible to maintain the high measurement accuracy.

Subsequently, the measuring mask M1, which is arranged in Step S20, is illuminated with the light having a predetermined wavelength, i.e., the measuring light having the same wavelength as that of the light used for the exposure (Step S22). The images of the measuring patterns are projected onto the apertures 43, 44 of the measuring device 20, via the measuring patterns 40, 41 and the projection optical system 15.

Subsequently, the sensor section 20a detects the measuring light passing through the measuring pattern 40 and via the aperture 43 and the measuring light passing through the measuring pattern 41 and via the aperture 44 respectively in accordance with the setting operation effected by the setting section 20b (Step S23). Specifically, the sensor section 20a detects a total amount or sum total I1 of the light amount of the measuring light passing through the aperture 43, and the sensor section 20a detects a total amount or sum total I2 of the light amount of the measuring light passing through the aperture 44. The total amounts I1, I2 of the light amounts measured by the sensor section 20a are outputted to the controller 30.

Figure 6:
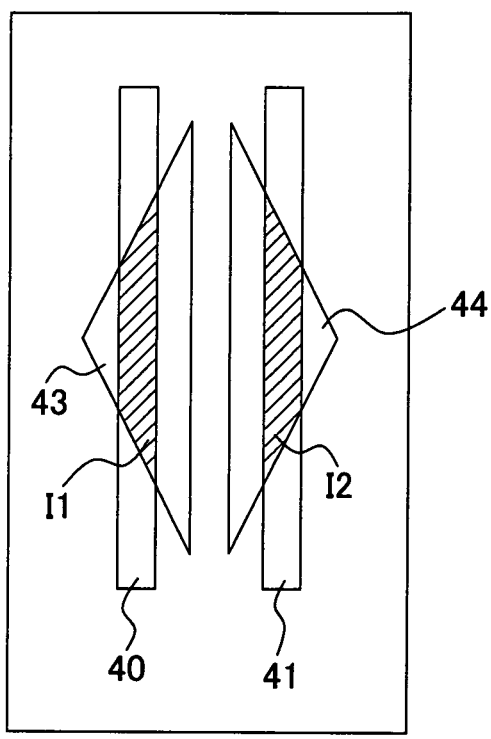
FIG. 6 illustrates a relationship of the total amounts or sum totals of two light amounts when there is no distortion of the projection optical system.

Subsequently, the total amounts I1, I2 of the light amounts, which are detected in Step S23, are compared with each other (Step S24), and the distortion of the projection optical system 15 is measured by using a result of the comparison performed in Step S24 (Step S25, measuring step). In this procedure, the positional relationship of the images of the measuring patterns 40, 41 with respect to the apertures 43, 44 is set so that the total amount I1 of the light amount of the measuring light passing through the aperture 43 is identical with the total amount I2 of the light amount of the measuring light passing through the aperture 44 as shown in FIG. 6 if the projection optical system 15 has no distortion (in the case of the distortion amount=0). Therefore, if the projection optical system 15 has no distortion (in the case of the distortion amount=0), then the total amount I1 of the light amount of the measuring light passing through the aperture 43 is equal to the total amount I2 of the light amount of the measuring light passing through the aperture 44, and the difference between the light amounts ΔI is ΔI=I1−I2=0.

Figure 7:
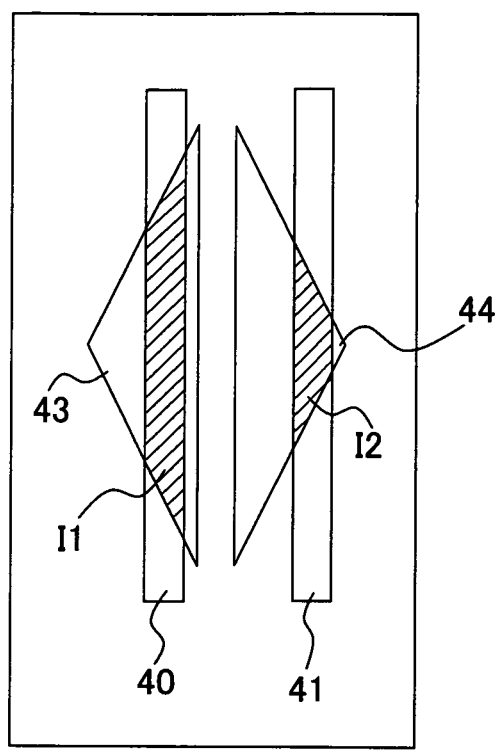
FIG. 7 illustrates a relationship of the total amounts or sum totals of two light amounts when there is a distortion of the projection optical system.
Figure 8:
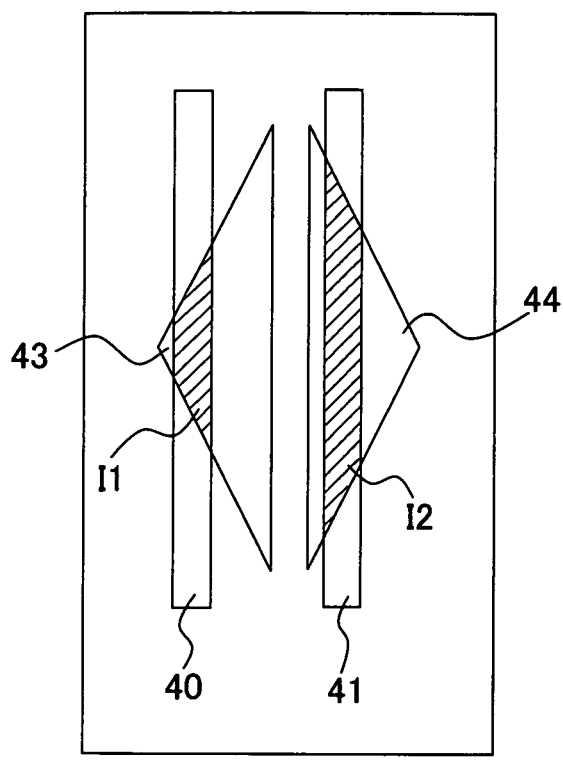
FIG. 8 illustrates a relationship of the total amounts or sum totals of two light amounts when there is a distortion of the projection optical system.
Figure 9:
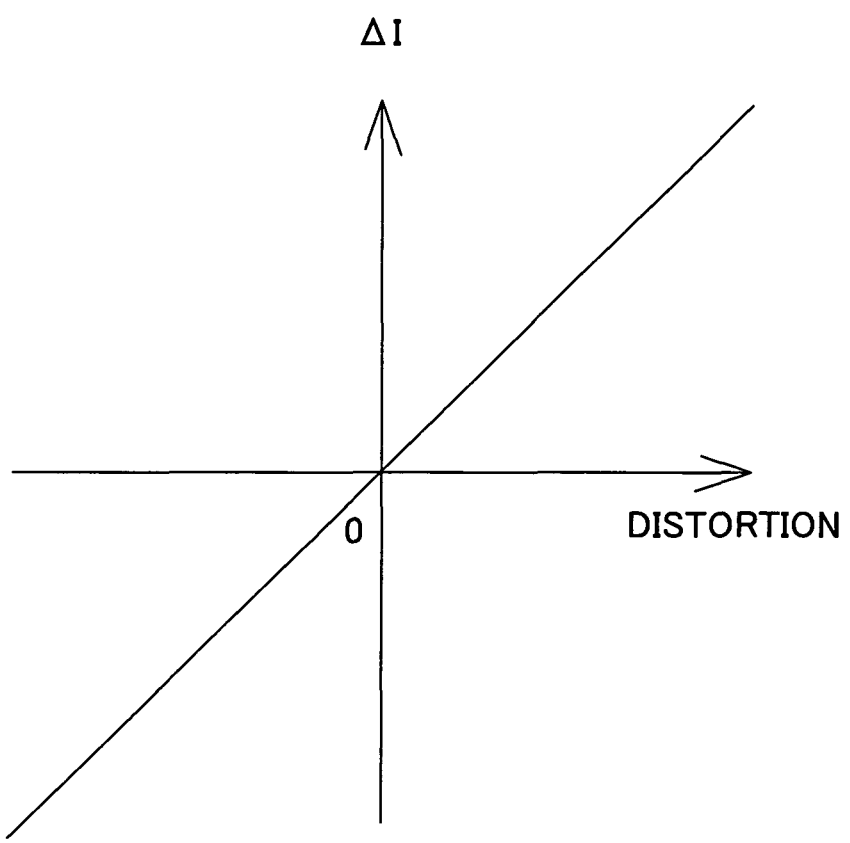
FIG. 9 shows a graph illustrating a relationship between the distortion of the projection optical system and the difference between the total amounts of the two light amounts.

On the other hand, if the projection optical system 15 has any distortion (in the case of the distortion amount≠0), the positions of the images of the measuring patterns 40, 41 with respect to the apertures 43, 44 are changed as shown in FIG. 7 or 8. Therefore, the total amount I1 of the light amount of the measuring light passing through the aperture 43 is different from the total amount I2 of the light amount of the measuring light passing through the aperture 44, and the difference between the light amounts ΔI is ΔI=I1−I2≠0. As shown in FIG. 9, the distortion and ΔI are in a relationship of direct proportion. Therefore, the distortion of the projection optical system 15 can be measured by determining ΔI.

Figure 2:
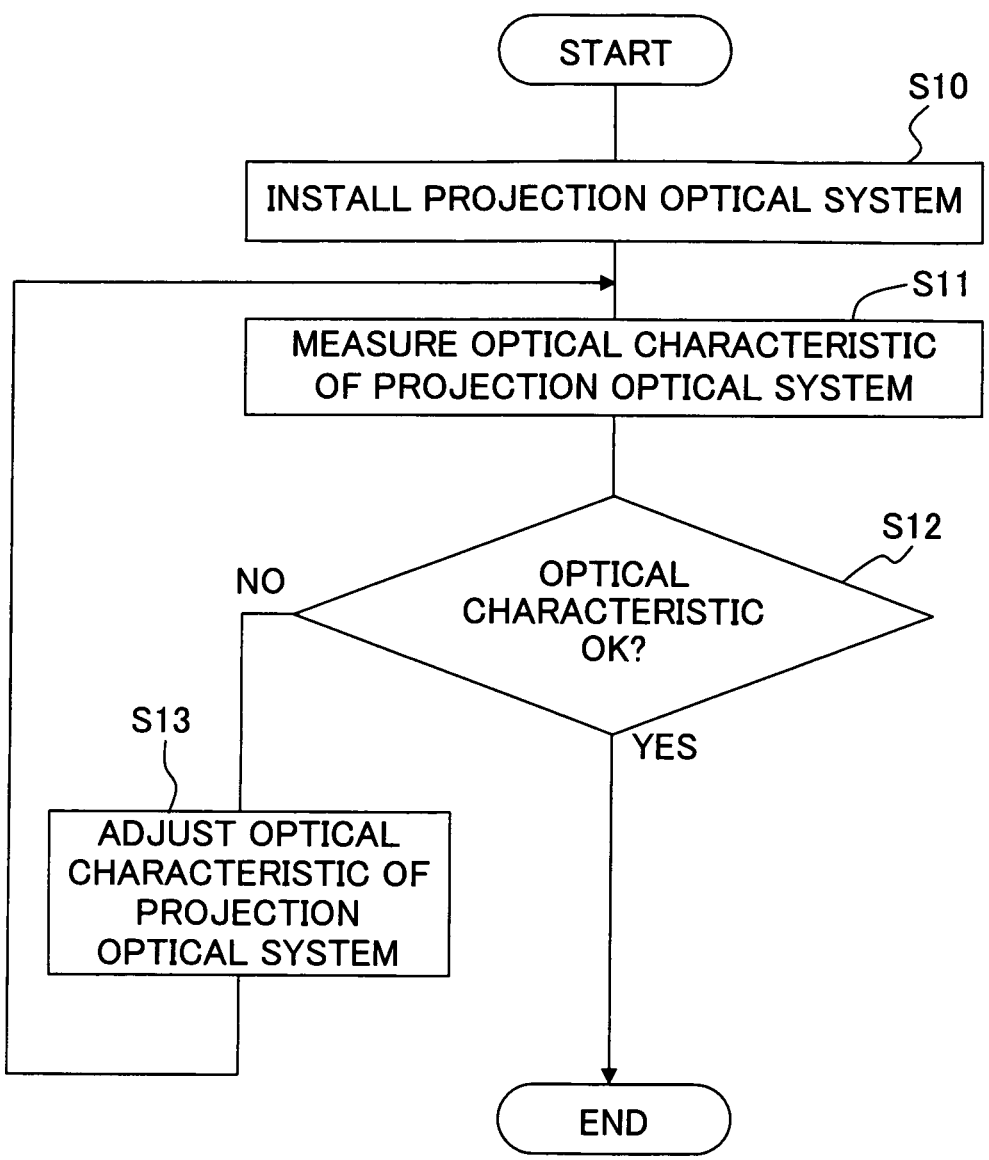
FIG. 2 shows a flow chart for illustrating a method for producing the projection exposure apparatus according to the embodiment.

The adjustment of the optical characteristic of the projection optical system 15 (adjusting step in Step S13), which is based on the amount of the distortion of the projection optical system 15 measured in Step S11 in the flow chart shown in FIG. 2, is executed by calculating the adjustment amount to correct the distortion so that the distortion of the projection optical system 15 is adjusted. Specifically, the distortion of the projection optical system 15 is adjusted by subjecting at least one of the optical members constructing the projection optical system 15 to the movement in the optical axis direction of the projection optical system 15, the shift or the inclination in the direction perpendicular to the optical axis of the projection optical system 15, and/or the rotation about the center of the optical axis of the projection optical system 15.

According to the projection exposure apparatus concerning this embodiment, the apertures 43, 44 of the light-receiving pattern have such shapes that the light amount of the measuring light passing via the projection optical system 15 are changed depending on the distortion amount of the projection optical system 15. Therefore, it is possible to highly accurately measure the distortion of the projection optical system 15 without moving the aperture provided on the wafer stage relative to the spatial image of the measuring pattern as performed in the conventional method for measuring the optical characteristic. Therefore, the projection optical system 15, which has the satisfactory optical characteristic, can be obtained by adjusting the distortion of the projection optical system 15 by using the measurement result. The image of the pattern of the mask M can be formed at a high resolution on the wafer W via the projection optical system 15 having the satisfactory optical characteristic.

According to the method for measuring the optical characteristic concerning this embodiment, it is unnecessary to move the aperture provided on the wafer stage relative to the spatial image of the measuring pattern, unlike the conventional method for measuring the optical characteristic. Therefore, it is possible to highly accurately measure the optical characteristic (distortion) of the projection optical system 15 without being affected by the movement accuracy of the wafer stage. The movement time for the wafer stage is also unnecessary. Therefore, it is possible to greatly shorten the measuring time. According to the method for measuring the optical characteristic concerning this embodiment, it is enough to detect the total amounts of the light amounts of the measuring light passing through the apertures 43, 44. Therefore, it is possible to use a sensor having a rough spatial resolution without depending on the spatial resolution of the pattern. Further, it is enough that the light amount of the measuring light is directly detected by the sensor section. Therefore, it is unnecessary to provide any relay optical system, etc. between the light-receiving pattern and the sensor section. It is possible to measure the optical characteristic of the projection optical system 15 by the compact and low cost measuring device.

According to the method for adjusting the optical characteristic concerning this embodiment, the optical characteristic of the projection optical system 15 is measured in accordance with the method for measuring the optical characteristic concerning this embodiment, and the optical characteristic of the projection optical system 15 is adjusted by using the obtained measurement result. Therefore, it is possible to obtain the optical system having the satisfactory optical characteristic in which the aberration is sufficiently corrected.

According to the method for producing the projection exposure apparatus concerning this embodiment, the optical characteristic of the projection optical system 15 is measured and adjusted in accordance with the method for measuring the optical characteristic and the method for adjusting the optical characteristic concerning this embodiment. Therefore, it is possible to produce the exposure apparatus provided with the projection optical system having the satisfactory optical characteristic in which the aberration is sufficiently corrected.

Figure 10:
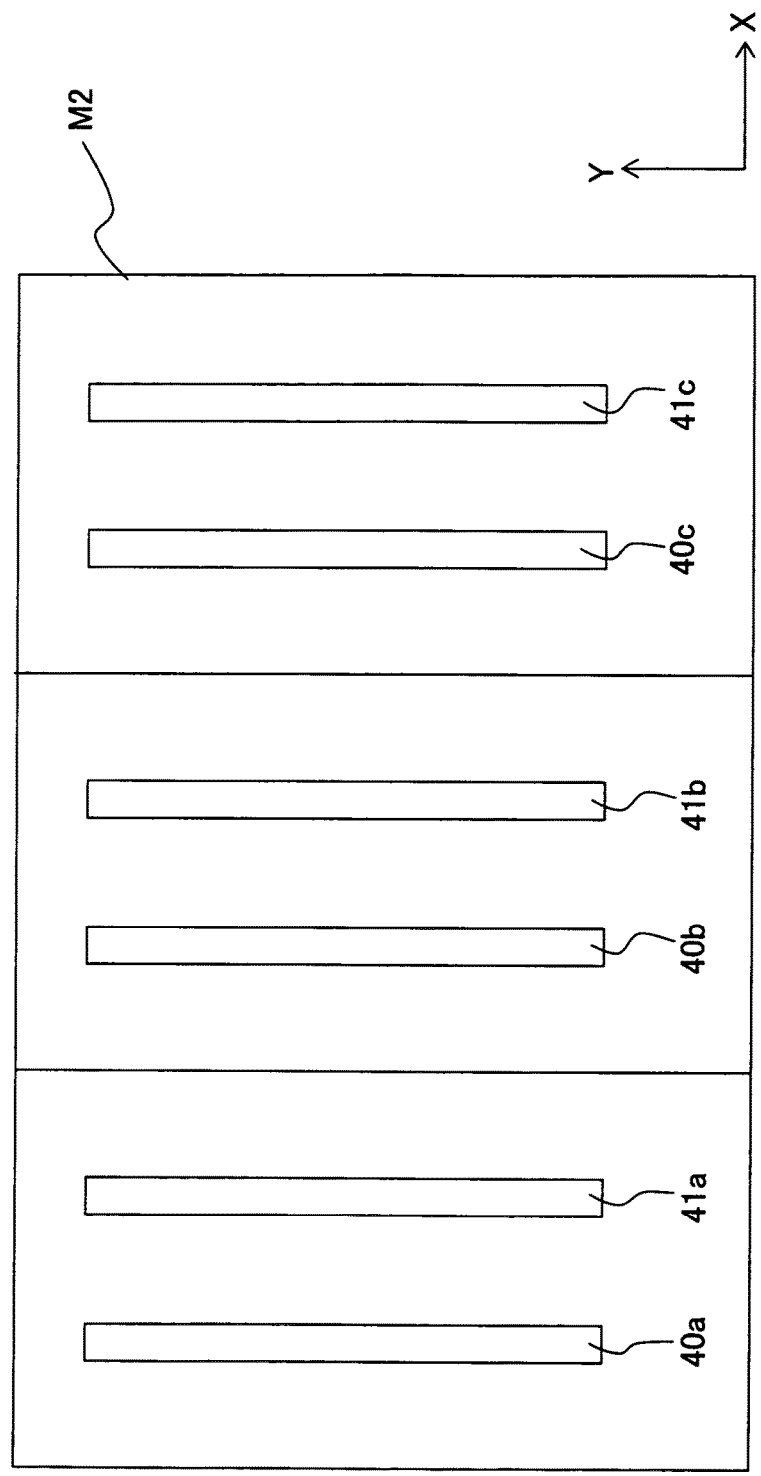
FIG. 10 shows a construction of another measuring mask according to the embodiment.
Figure 11:
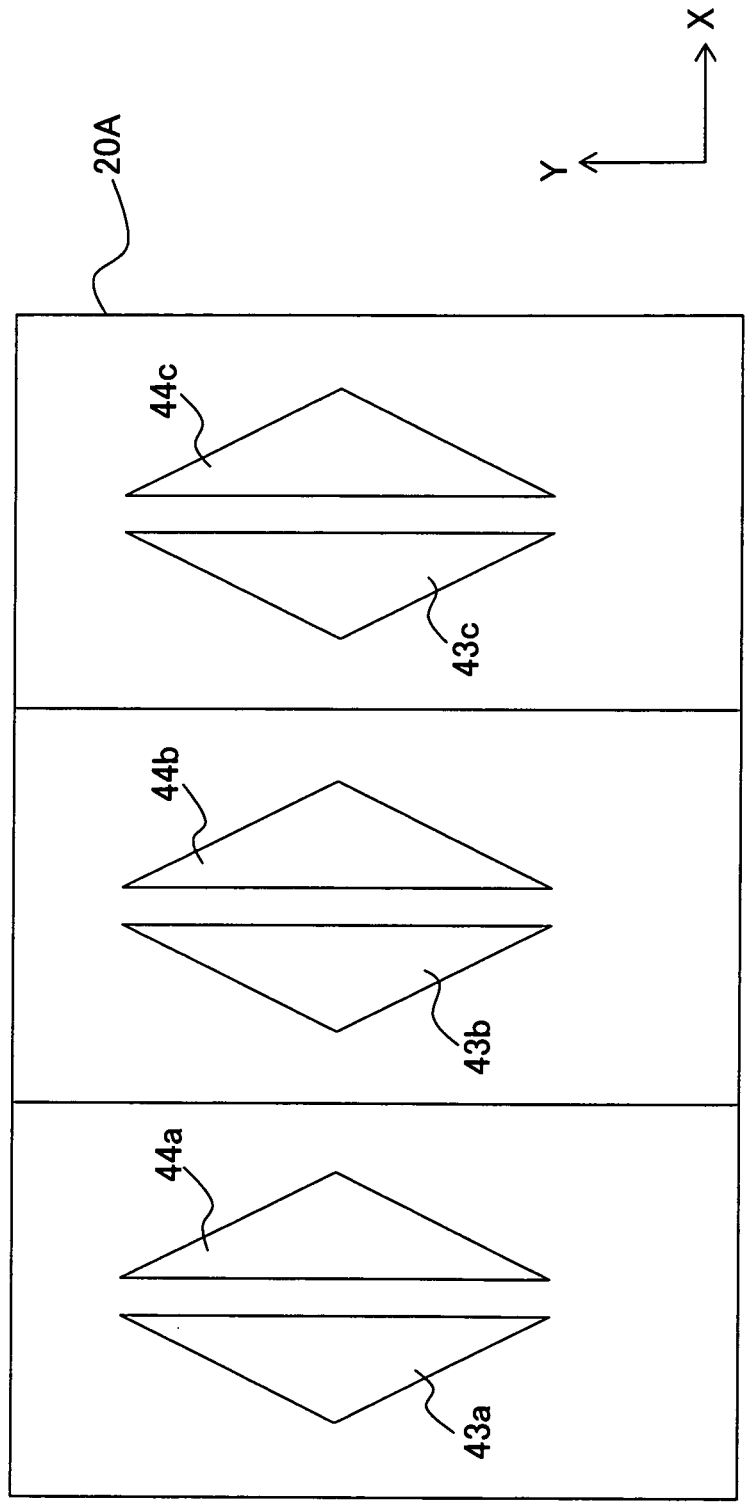
FIG. 11 shows a construction of another measuring device according to the embodiment.

In the method for measuring the optical characteristic according to this embodiment, the distortion of the projection optical system 15 is measured by using the measuring mask M1 as shown in FIG. 4 and the measuring device 20 as shown in FIG. 5 (FIGS. 5A and 5B). However, the distortion of the projection optical system 15 may be measured, for one measuring point, by using a measuring mask having two or more sets of measuring patterns having identical shapes and a measuring device having two or more sets of apertures. The distortion of the projection optical system 15 may be measured by using, for example, a measuring mask M2 which is formed with three sets of measuring patterns 40a, 41a, 40b, 41b, 40c, 41c as shown in FIG. 10 and a measuring device 20A which is provided with a pattern plate formed with three sets of apertures 43a, 44a, 43b, 44b, 43c, 44c as shown in FIG. 11. The shapes of the apertures 43a to 43c are same as or equivalent to the shape of the aperture 43 shown in FIG. 5, and the shapes of the apertures 44a to 44c are the same as or equivalent to the shape of the aperture 44 shown in FIG. 5.

In this case, a total amount 13 or an average value A3 of the light amounts of the measuring light passing through the aperture 43a via the measuring pattern 40a and the projection optical system 15, the measuring light passing through the aperture 43b via the measuring pattern 40b and the projection optical system 15, and the measuring light passing through the aperture 43c via the measuring pattern 40c and the projection optical system 15 is measured. Similarly, a total amount 14 or an average value A4 of the light amounts of the measuring light passing through the aperture 44a via the measuring pattern 41a and the projection optical system 15, the measuring light passing through the aperture 44b via the measuring pattern 41b and the projection optical system 15, and the measuring light passing through the aperture 44c via the measuring pattern 41c and the projection optical system 15 is measured. The distortion of the projection optical system 15 is measured based on the result of comparison between the total amount 13 or the average value A3 of the light amounts and the total amount 14 or the average value A4 of the light amounts. According to this measuring method, it is possible to measure the distortion amount more highly accurately.

Figure 12:
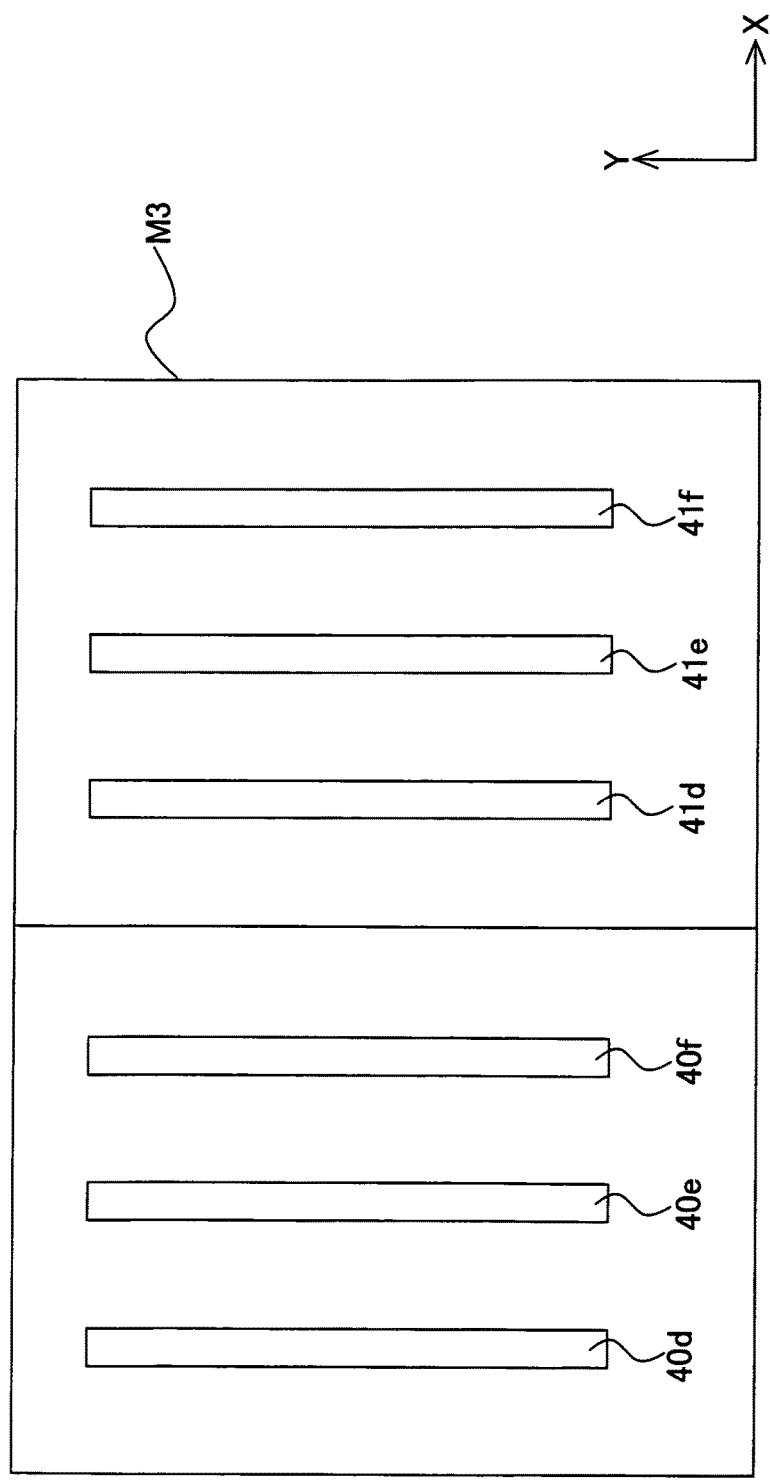
FIG. 12 shows a construction of still another measuring mask according to the embodiment.
Figure 13:
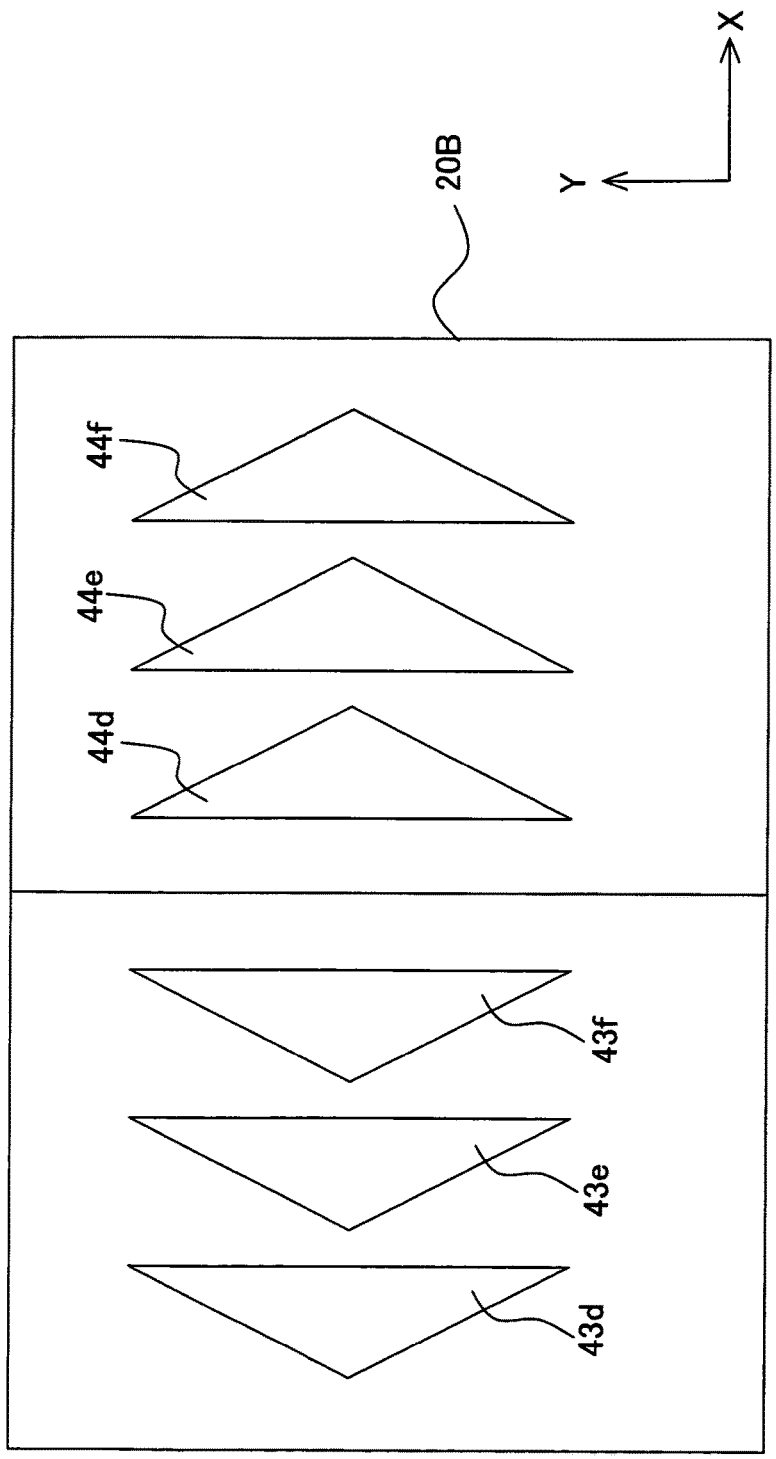
FIG. 13 shows a construction of still another measuring device according to the embodiment.

Alternatively, the distortion of the projection optical system 15 may be measured by using, for example, a measuring mask M3 which is formed with three sets of measuring patterns 40d, 40e, 40f, 41d, 41e, 41f as shown in FIG. 12 and a sensor 20B which is provided with a pattern plate formed with three sets of apertures 43d, 43e, 43f, 44d, 44e, 44f as shown in FIG. 13. The respective shapes of the apertures 43d to 43f, 44d to 44f are same as or equivalent to the shape of the aperture 43 or the aperture 44 shown in FIG. 5.

In this case, a total amount 15 of the light amounts of the measuring light passing through the aperture 43d via the measuring pattern 40d and the projection optical system 15, the measuring light passing through the aperture 43e via the measuring pattern 40e and the projection optical system 15, and the measuring light passing through the aperture 43f via the measuring pattern 40f and the projection optical system 15 is measured. Similarly, a total amount 16 of the light amounts of the measuring light passing through the aperture 44d via the measuring pattern 41d and the projection optical system 15, the measuring light passing through the aperture 44e via the measuring pattern 41e and the projection optical system 15, and the measuring light passing through the aperture 44f via the measuring pattern 41f and the projection optical system 15 is measured. The distortion of the projection optical system 15 is measured based on the result of comparison between the total amount 15 of the light amounts and the total amount 16 of the light amounts. According to this measuring method, it is also possible to perform the measurement more highly accurately.

In the method for measuring the optical characteristic according to this embodiment, the light amount of the measuring light is detected at one image point in the projection area of the projection optical system 15. However, the light amount of the measuring light may be measured at a plurality of image points in the projection area of the projection optical system 15. The optical characteristic of the projection optical system 15 may be measured by using, for example, a measuring mask M4 which is formed with five sets of measuring patterns 50 to 54 as shown in FIG. 14 and a measuring device 20C which is provided with a pattern plate formed with five sets of light-receiving patterns 55 to 59 as shown in FIG. 15.

Figure 14:
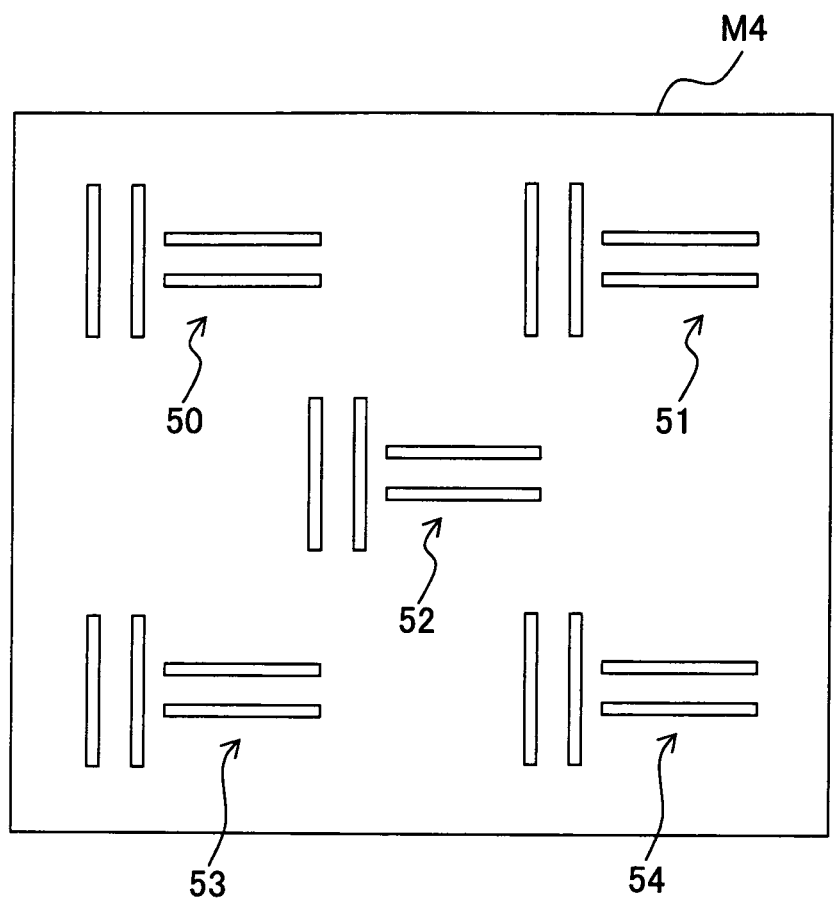
FIG. 14 shows a construction of still another measuring mask according to the embodiment.
Figure 15:
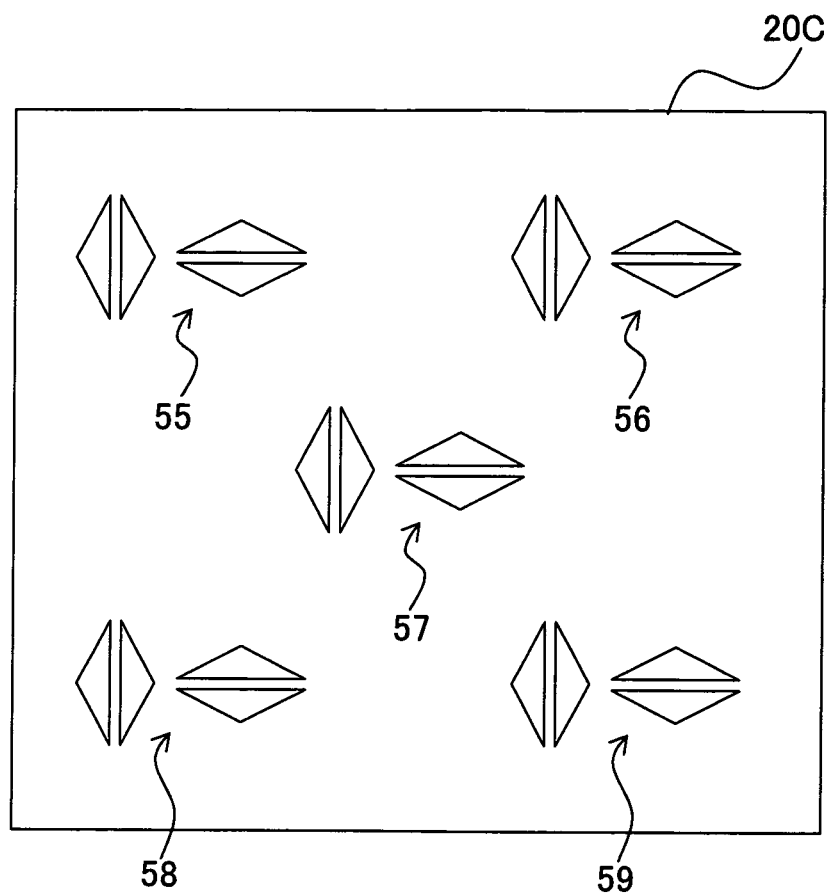
FIG. 15 shows a construction of still another measuring device according to the embodiment.

As shown in FIG. 14, two types of measuring patterns, which are of mutually different types, are formed on the measuring mask M4. In this embodiment, each of the measuring patterns 50 to 54 is formed as the two types of measuring patterns of the mutually different types. Each of the measuring patterns is formed with two line patterns each of which has a width of several μm and which are formed in the two measuring directions (X direction and Y direction) perpendicular to each other. As shown in FIG. 15, two types of apertures, which are of mutually different types, are formed on the pattern plate of the measuring device 20. In this embodiment, the apertures, which have the same or equivalent shapes as those of the apertures according to the embodiment described above, are formed as the two types of the apertures of the mutually different types corresponding to the measuring patterns 50 to 54, respectively. The respective apertures are formed in the two measuring directions perpendicular to each other.

In a case that the optical characteristic of the projection optical system 15 is measured by using the measuring mask M4 and the measuring device 20C, the light amount of the measuring light can be simultaneously measured at a plurality of image heights in the projection area of the projection optical system 15. Therefore, it is possible to measure the optical characteristic of the projection optical system 15 at the different image heights quickly and highly accurately. In this embodiment, the measurement of the distortion has been explained by way of example. However, in a case that the comatic aberration of the projection optical system 15 is measured, it is appropriate to use a measuring mask which is formed with a plurality of measuring patterns having different widths and a measuring device which is provided with a pattern plate formed with apertures according to this embodiment and provided corresponding to the measuring patterns respectively. In the case that the comatic aberration is measured, it is also allowable to use only at least one of the aperture 43 and the aperture 44.

Even when the shape of the measuring pattern is identical or same, it is also possible to perform the measurement in which the dynamic range and/or the sensitivity is/are different, by providing two or more apertures of mutually different types (for example, the forming direction, the pitch, and the line width).

The setting section is connected to the measuring device 20B shown in FIG. 11, the measuring device 20C shown in FIG. 13, and the measuring device 20D shown in FIG. 15, in the same manner as the measuring device 20 shown in FIG. 5. One or more reference aperture or reference apertures may be provided on the light-receiving pattern surface of each of the measuring devices 20B to 20D to monitor the light amount of the measuring light illuminating the measuring mask therewith.

In the method for measuring the optical characteristic according to this embodiment, the distortion of the projection optical system 15 is measured by comparing the total amount I1 of the light amounts of the measuring light passing through the aperture 43 and the total amount I2 of the light amounts of the measuring light passing through the aperture 44. However, only the measuring light, which has passed through the aperture 43 or the aperture 44, may be detected, and the distortion of the projection optical system 15 can be measured in accordance with an obtained detection result as well. For example, the measuring light, which has passed through the aperture 43 (or the aperture 44), is detected at every predetermined period of time, and the time-dependent change of the amount of the distortion of the projection optical system 15 is measured in accordance with the time-dependent change amount of the total amount I1 (or I2) of the light amounts of the measuring light passing through the aperture 43 (or the aperture 44).

In this embodiment, the aperture shown in FIG. 5, 11, 13, or 15 has the shape in which the change occurs depending on the optical characteristic of the projection optical system 15. However, the shape of the aperture shown in FIG. 5, 11, 13, or 15 may be formed on a measuring mask, and the shape of the measuring pattern shown in FIG. 4, 10, 12, or 14 may be formed on a pattern plate of the measuring device. In a case that the apertures, each of which has such a shape that the change occurs depending on the optical characteristic of the projection optical system 15, are formed on a measuring mask and a pattern plate of the measuring device, the shape of the measuring pattern formed on the measuring mask and the shape of the aperture formed on the pattern plate may be mutually different.

Figure 16:
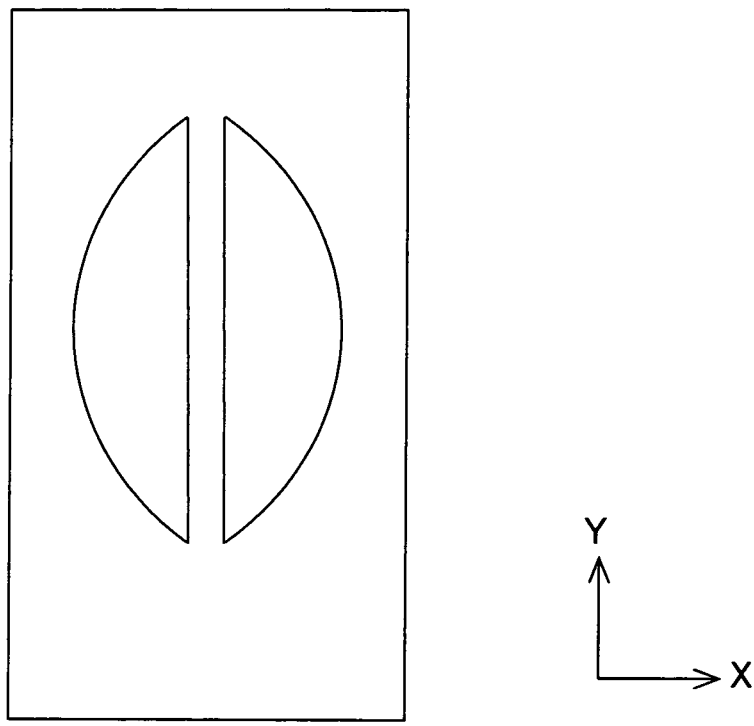
FIG. 16 shows a construction of another apertures according to the embodiment.
Figure 17A:
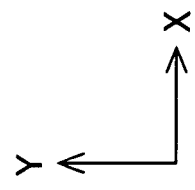
FIG. 17 shows constructions of still another apertures according to the embodiment.
Figure 17B:
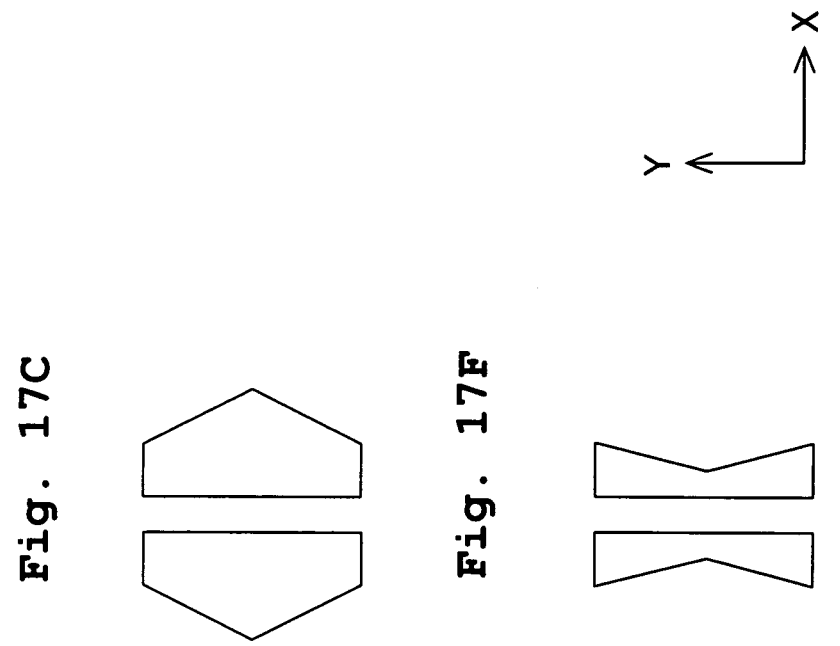
Figure 17C:
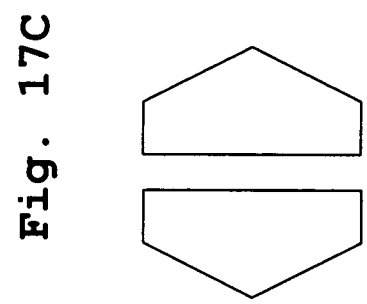
Figure 17D:
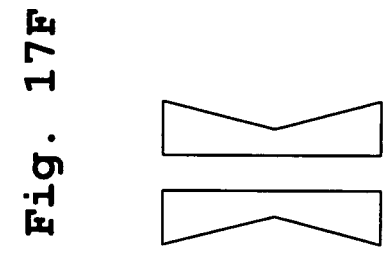
Figure 17E:
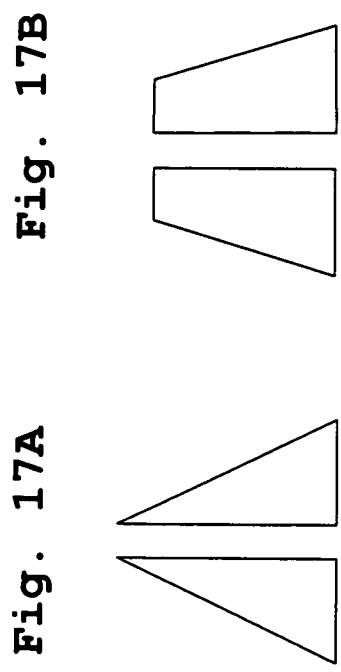
Figure 17F:
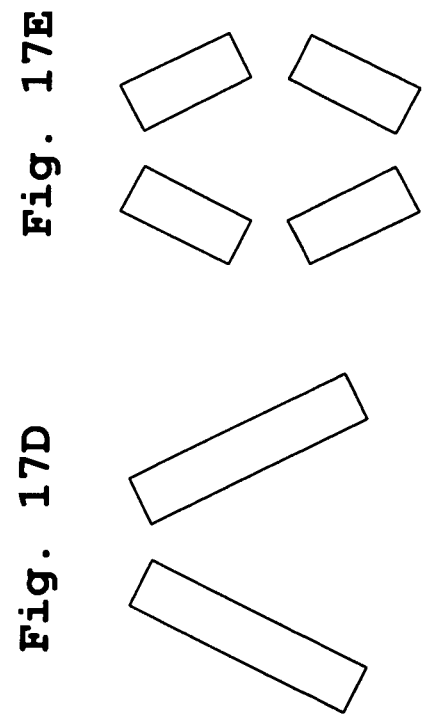

This embodiment is explained as exemplified by the apertures shown in FIGS. 5, 11, 13, and 15 by way of example. However, for example, it is also allowable to adopt apertures each of which has a curved line in the direction (Y direction) perpendicular to the measuring direction, as shown in FIG. 16. Alternatively, it is also allowable to adopt apertures as shown in FIGS. 17A to 17F. That is, it is appropriate to adopt any aperture having a shape which has an angle θ of 0<θ<90 (degrees) with respect to the measuring direction (X direction) so that the light amount of the measuring light passing therethrough is changed depending on the optical characteristic of the projection optical system 15.

In this embodiment, the optical characteristic of the projection optical system is measured by using the aperture type measuring pattern through which the light is passing as formed in a part of the light shielding area and the aperture through which the light is passing as formed in a part of the light shielding area. However, the measuring pattern may be of the transmission type through which the light is transmitted or of the reflection type by which the light is reflected, and the aperture may be of the transmission type or of the reflection type. This embodiment is illustrative of the exemplary case in which the measuring light is detected by using the measuring pattern and the aperture by way of example. However, the light-shielding area and the area for allowing the light to pass therethrough may be inverted or reversed. Alternatively, a liquid crystal display device may be used as the measuring mask and/or the pattern plate to electrically generate the measuring pattern and/or the aperture. Of course, a shutter mechanism may be provided for the measuring mask and/or the pattern plate to mechanically prepare or form the measuring pattern and/or the aperture.

In the embodiment described above, the light-receiving areas, which distinctly receive the lights passing through the respective apertures respectively, are set by the setting section in the light-receiving areas of one sensor section. However, a plurality of sensor sections may be used to receive the respective lights passing through the respective apertures by the respective sensor sections.

In this embodiment, the optical characteristic of the projection optical system 15 is measured by irradiating or radiating the measuring light from the object side of the projection optical system 15 and by detecting the measuring light via the image plane of the projection optical system 15. However, the measuring light may be radiated from the image plane side of the projection optical system 15, and the measuring light may be detected via the object plane of the projection optical system 15.

In this embodiment, the light amount of the measuring light passing through the reference aperture is monitored so that no influence is exerted by the change of the light amount of the illumination light. However, the reference aperture may be omitted by determining the difference $\Delta I$ in the light amount by using the expression of $\Delta I = (I1-I2)/(I1+I2)$.

In the method for producing the projection exposure apparatus according to this embodiment, the exemplary case has been explained by way of example, in which the projection exposure apparatus is provided with the measuring device which measures the optical characteristic of the projection optical system 15, and the optical characteristic of the projection optical system 15 is measured and adjusted after installing the projection optical system 15 in the projection exposure apparatus. However, the optical characteristic of the projection optical system 15 may be measured in accordance with the method for measuring the optical characteristic according to this embodiment, and the optical characteristic may be adjusted based on an obtained result before installing the projection optical system 15 in the projection exposure apparatus. As for the adjustment of the optical characteristic of the projection optical system 15, in a case that the focus position is corrected, then wedge-shaped pair glass members may be relatively rotated, and/or the position of the stage may be controlled.

In this case, the optical characteristic of the projection optical system 15 can be also adjusted by machining or processing (for example, repolishing) or exchanging at least one of the optical members constructing the projection optical system 15, in addition to the adjustment of the optical characteristic of the projection optical system 15 as described above.

In this embodiment, the method for measuring the optical characteristic of the projection optical system has been explained. However, the optical characteristics of all imaging optical systems can be measured by using the optical characteristic measuring method.

In this embodiment, the construction has been explained, in which the measuring device 20 is attached to the wafer stage 16. However, the measuring device 20 may be provided detachably with respect to the wafer stage 16.

Both of the wafer stage and the measuring stage may be prepared for the exposure apparatus, and the measuring device 20 may be provided on or for the measuring stage.

The embodiment of the present invention is also applicable to a liquid immersion type exposure apparatus in which the liquid is allowed to intervene or is disposed between the projection optical system and the wafer. The embodiment of the present invention is also applicable to an EUV exposure apparatus which includes an illumination optical system and a projection optical system constructed of reflection type optical members, etc., wherein the extreme ultraviolet light (EUV light) is used as the exposure light.

With the projection exposure apparatus according to the embodiment described above, a microdevice (a semiconductor element, an image pickup element, a liquid crystal display element, a thin film magnetic head, etc.) can be produced by forming, on a photosensitive substrate (wafer W), a transfer pattern formed by a mask M by using the projection optical system 15 (forming step). An explanation will be made below with reference to a flow chart shown in FIG. 18 about an exemplary procedure adopted upon obtaining the semiconductor device as the microdevice by forming a predetermined circuit pattern, for example, on the wafer W as the photosensitive substrate by using the projection exposure apparatus according to the embodiment described above.

Figure 18:
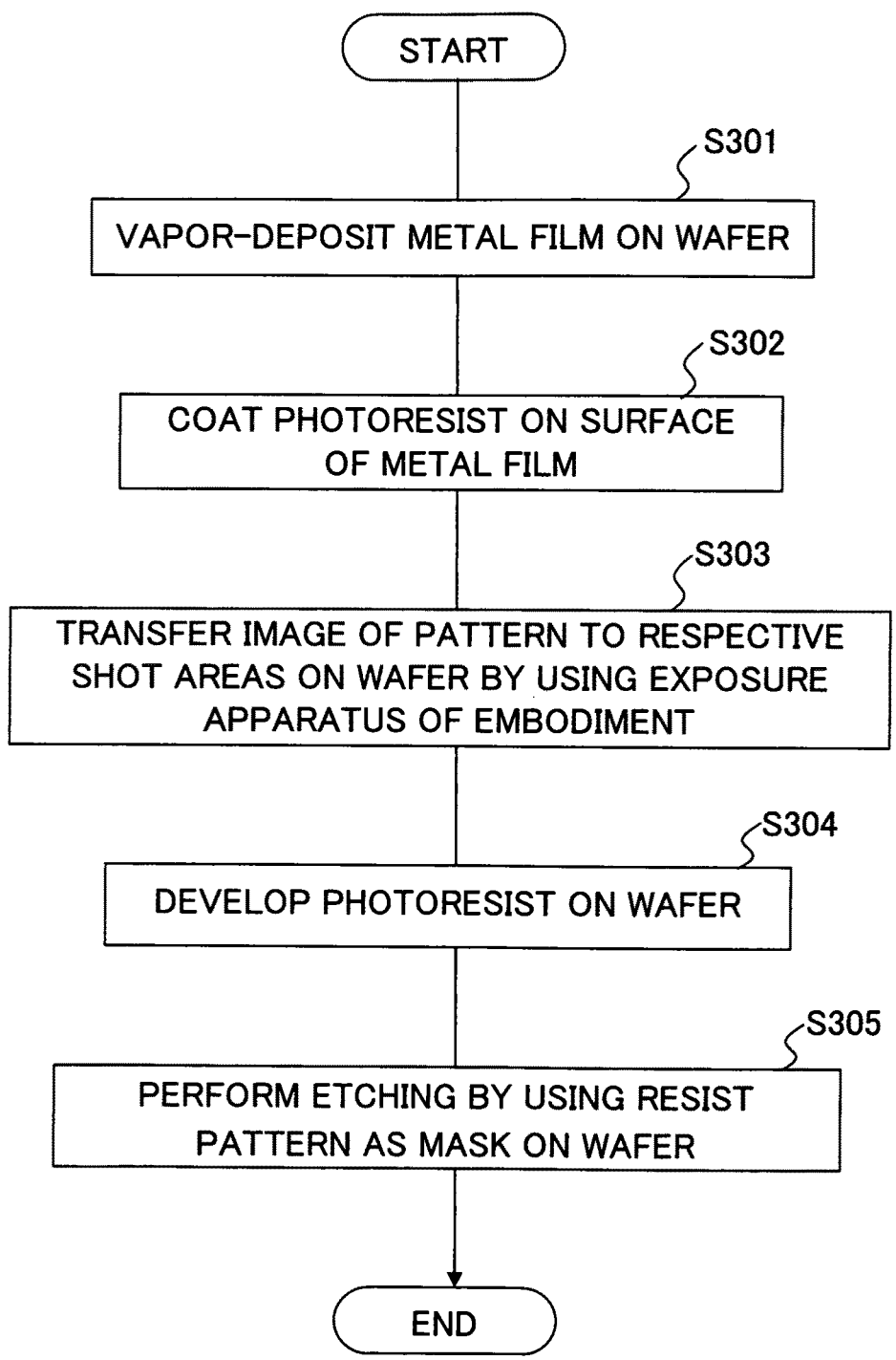
FIG. 18 shows a flow chart illustrating a method for producing a semiconductor device as a microdevice according to the embodiment.

At first, in Step S301 shown in FIG. 18, a metal film is vapor-deposited on each of wafers W of 1 lot. Subsequently, in Step S302, a photoresist is coated on a surface of the metal film on each of the wafers W of 1 lot. After that, in Step S303, the pattern, which is formed on the mask M, is illuminated with the illumination light by using the projection exposure apparatus according to the embodiment described above (illuminating step). The image of the pattern illuminated with the illumination light is successively transferred to the respective shot areas on each of the wafers W of 1 lot to perform the exposure via the projection optical system 15 having the optical characteristic measured and adjusted in accordance with the optical characteristic measuring method and the optical characteristic adjusting method according to this embodiment (exposure step). After that, the photoresist on each of the wafers W of 1 lot is developed in Step S304, and then the etching is performed by using the resist pattern as a mask on each of the wafers W of 1 lot in Step S305. Accordingly, the circuit pattern, which corresponds to the pattern of the mask M, is formed on each of the shot areas on each of the wafers W.

After that, for example, circuit patterns of upper layers are formed, and thus the device such as the semiconductor element or the like is produced. According to the exposure method concerning this embodiment, the exposure is performed by using the projection optical system 15 adjusted in accordance with the method for adjusting the optical characteristic concerning this embodiment. Therefore, the image of the pattern of the mask M can be formed at a high resolution on the wafer W. In Step S301 to Step S305, the metal is vapor-deposited on the wafer W, and the surface of the metal film is coated with the resist to perform the respective steps of the exposure, the development, and the etching. However, it goes without saying that a silicon oxide film may be formed on the wafer W prior to these steps, and then the surface of the silicon oxide film may be coated with the resist to perform the respective steps of the exposure, the development, the etching, etc.

The present invention relates to the theme or the subject included in Japanese Patent Application No. 2007-167857 filed on Jun. 26, 2007, the entire disclosure of which is evidently incorporated herein by reference.

The optical characteristic adjusting method of the present invention is useful to measure the optical characteristic of the optical system usable to produce the electronic device such as the semiconductor element, the liquid crystal display element or the like in the lithography step. The optical characteristic of the optical system can be adjusted highly accurately by using the exposure apparatus provided with the optical system adjusted in accordance with the optical characteristic adjusting method of the present invention and the exposure method using the exposure apparatus. The exposure apparatus, which is provided with the optical system having the satisfactory optical characteristic, can be produced in accordance with the exposure apparatus producing method for producing the exposure apparatus.

What is claimed is:

1. An optical characteristic measuring method for measuring an optical characteristic of an optical system which forms, on a second plane, an image of an object arranged on a first plane, the optical characteristic measuring method comprising:
    arranging, on the first plane, a first area through which a measuring light passes or by which the measuring light is reflected;
    arranging a second area, through which the measuring light passes or by which the measuring light is reflected, on the second plane at a position corresponding to the first area; and
    detecting, via one of the first area and the second area, a light amount of the measuring light via the optical system and the other of the first area and the second area;
    wherein at least one of the first area and the second area includes a plurality of apertures through which the measuring light passes simultaneously or by which the measuring light is reflected simultaneously, a shape of each of the apertures having a plurality of widths extending in a measuring direction of the optical characteristic at positions in a direction perpendicular to the measuring direction, the plurality of widths including a first width, a second width which is greater than the first width, and a third width which is greater than the second width,
    wherein the measuring direction is a direction in which the image of the first area arranged on the first plane shifts depending on a change of the optical characteristic of the optical system.

2. The optical characteristic measuring method according to claim 1, wherein the first area and the second area have mutually different shapes.

3. The optical characteristic measuring method according to claim 1, wherein the shape of the at least one of the first area and the second area has an angle θ of 0 <θ<90 degrees with respect to the measuring direction.

4. The optical characteristic measuring method according to claim 1, wherein the shape of the at least one of the first area and the second area has a curved line in a direction which intersects the measuring direction.

5. The optical characteristic measuring method according to claim 1, wherein two or more pieces of the first area are arranged in the first plane; and
    two or more pieces of the second area are arranged in the second plane corresponding to the two or more pieces of the first area.

6. The optical characteristic measuring method according to claim 5, wherein types of the two or more pieces of the first area are mutually different.

7. The optical characteristic measuring method according to claim 5, wherein types of the two or more pieces of the second area are mutually different.

8. The optical characteristic measuring method according to claim 1, wherein the optical characteristic is an aberration which is asymmetrical with respect to an optical axis of the optical system in relation to the measuring direction.

9. An optical characteristic adjusting method comprising:
    measuring an optical characteristic of an optical system in accordance with the optical characteristic measuring method as defined in claim 1; and
    adjusting the optical characteristic of the optical system by using a measurement result obtained in the measuring.

10. The optical characteristic adjusting method according to claim 9, wherein in the adjusting, the optical characteristic is adjusted by machining or exchanging at least one optical member which constructs the optical system.

11. The optical characteristic adjusting method according to claim 9, wherein the optical characteristic is adjusted in the adjusting by moving at least one optical member which constructs the optical system in a direction of an optical axis of the optical system, by shifting or inclining the at least one optical member in a direction perpendicular to the optical axis, or by rotating the at least one optical member about a center of the optical axis.

12. An exposure apparatus which exposes a pattern of a mask on a photosensitive substrate, the exposure apparatus comprising:
    an optical system which is adjusted in accordance with the optical characteristic adjusting method as defined in claim 9.

13. An exposure apparatus which exposes a pattern of a mask via an optical system on a photosensitive substrate, the exposure apparatus comprising:
    a first pattern having a first area which is arranged on one of an object plane and an image plane of the optical system and through which a measuring light passes or by which the measuring light is reflected;
    a second pattern having a second area which is arranged, on the other of the object plane and the image plane of the optical system, at a position corresponding to the first area and through which the measuring light passes or by which the measuring light is reflected; and
    a detecting section which detects, via one of the first pattern and the second pattern, a light amount of the measuring light via the optical system and the other of the first pattern and the second pattern;
    wherein at least one of the first area and the second area includes a plurality of apertures through which the measuring light passes simultaneously or by which the measuring light is reflected simultaneously, a shape of each of the apertures having a plurality of widths extending in a measuring direction of the optical characteristic at positions in a direction perpendicular to the measuring direction, the plurality of widths including a first width, a second width which is greater than the first width, and a third width which is greater than the second width,
    wherein the measuring direction is a direction in which an image, of the first pattern or the second pattern arranged on the object plane, via the optical system shifts depending on a change of the optical characteristic of the optical system.

14. An exposure method for forming a pattern of a mask on a photosensitive substrate, the exposure method comprising:
    illuminating the pattern; and
    projecting the illuminated pattern on the photosensitive substrate by an optical system adjusted in accordance with the optical characteristic adjusting method as defined in claim 9.

15. An exposure apparatus producing method for producing an exposure apparatus which exposes a pattern of a mask via an optical system on a photosensitive substrate, the exposure apparatus producing method comprising:
   adjusting an optical characteristic of the optical system in accordance with the optical characteristic adjusting method as defined in claim 9; and
   installing, in the exposure apparatus, the adjusted optical system.

16. An exposure apparatus producing method for producing an exposure apparatus which exposes a pattern of a mask via an optical system on a photosensitive substrate, the exposure apparatus producing method comprising:
   installing the optical system in the exposure apparatus; and
   adjusting an optical characteristic of the optical system installed in the exposure apparatus in accordance with the optical characteristic adjusting method as defined in claim 9.

17. The exposure apparatus according to claim 13, wherein the first area and the second area have mutually different shapes.

18. The exposure apparatus according to claim 13, wherein the shape of the at least one of the first area and the second area has an angle θ of 0<θ<90 degrees with respect to the measuring direction.

19. The exposure apparatus according to claim 13, wherein the optical characteristic is an aberration which is asymmetrical with respect to an optical axis of the optical system in relation to the measuring direction.

20. The exposure apparatus according to claim 13, wherein the optical system including an optical member through which an exposure light passes or by which the exposure light is reflected, and
   wherein the optical member moves in at least one of a first direction of an optical axis of the optical system, a second direction crossing to the first direction, a first rotational direction with the second direction as an axis, and a second rotational direction with the optical axis as an axis.

21. The exposure apparatus according to claim 20, further comprising:
   a controller configured to control the movement of the optical member by using a measurement result obtained from the detecting section.

* * * * *